US006587345B2

(12) United States Patent
Chu et al.

(10) Patent No.: US 6,587,345 B2
(45) Date of Patent: Jul. 1, 2003

(54) ELECTRONIC DEVICE SUBSTRATE ASSEMBLY WITH IMPERMEABLE BARRIER AND METHOD OF MAKING

(75) Inventors: Richard C. Chu, Hopewell Junction, NY (US); Michael J. Ellsworth, Jr., Lagrangeville, NY (US); Robert E. Simons, Poughkeepsie, NY (US); Prabjit Singh, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/047,497

(22) Filed: Nov. 9, 2001

(65) Prior Publication Data

US 2003/0090872 A1 May 15, 2003

(51) Int. Cl.⁷ .................................. H05K 7/20
(52) U.S. Cl. .................... 361/719; 29/890.03; 165/80.3
(58) Field of Search ................. 165/46, 80.3, 80.4, 165/104.33, 185; 29/830, 832, 840, 890.03; 438/118, 119, 124; 257/687, 710, 713, 714, 721–724; 361/699, 704, 715–720

(56) References Cited

U.S. PATENT DOCUMENTS

| 4,092,697 A | * 5/1978 | Spaight ...................... 361/718 |
| 4,138,692 A | * 2/1979 | Meeker et al. ................. 357/82 |
| 4,381,032 A | 4/1983 | Cutchaw ........................ 165/46 |
| 4,531,146 A | 7/1985 | Cutchaw ....................... 357/82 |
| 4,807,019 A | 2/1989 | Tustaniwskyj ............... 357/74 |
| 4,879,629 A | 11/1989 | Tustaniwskyj et al. ..... 361/385 |
| 5,195,020 A | * 3/1993 | Suzuki et al. ............... 361/699 |
| 5,224,017 A | 6/1993 | Martin ........................ 361/388 |
| 5,294,830 A | 3/1994 | Young et al. ................ 257/714 |
| 5,306,866 A | 4/1994 | Gruber et al. ............. 174/15.1 |
| 5,349,498 A | 9/1994 | Tanzer et al. ................ 361/689 |
| 5,388,635 A | 2/1995 | Gruber et al. ............. 165/80.4 |
| 5,638,597 A | 6/1997 | Cutting et al. ................. 29/830 |
| 5,656,862 A | 8/1997 | Papathomas et al. ........ 257/778 |

(List continued on next page.)

OTHER PUBLICATIONS

IBM Technical Disclosure Bulletin, vol. 24, No. 9, 2/82, A.Brunsch et al, "Semiconductor Chip Cooling System With Temperature Regulation", pp. 4796–4797.

IBM Technical Disclosure Bulletin, vol. 20, No. 2, 7/77, Loeffel et al, "Liquid Cooled Module With Compliant Membrane", pp. 673–674.

(List continued on next page.)

Primary Examiner—Gerald Tolin
(74) Attorney, Agent, or Firm—Andrew J. Wojnicki, Jr.

(57) ABSTRACT

An electronic module substrate assembly and fabrication method, the assembly providing good thermal conductivity between an electronic device and an aqueous coolant, while maintaining physical separation between the coolant and electronic device, and relieving mechanical stresses caused by mismatches in thermal coefficients of expansion of materials within the device assembly. The assembly includes a substrate, at least one electronic device, and a preformed, thermally conductive, impermeable barrier. The barrier is preformed into a plurality of regions, some of which are bonded to other structures. One barrier region preferably forms a fluid tight seal with the substrate perimeter. At least one other barrier region forms a low thermal resistance bond with the at least one electronic device. When incorporated into an electronic module assembly including a module cap, the substrate assembly provides physical separation between a cooling fluid introduced into the module cap, and both the substrate and electronic devices.

34 Claims, 9 Drawing Sheets

U.S. PATENT DOCUMENTS

| | | | | |
|---|---|---|---|---|
| 5,658,831 A | * | 8/1997 | Layton et al. | 29/832 |
| 5,668,059 A | | 9/1997 | Chtistie et al. | 438/118 |
| 5,727,310 A | | 3/1998 | Casson et al. | 29/830 |
| 5,786,629 A | | 7/1998 | Faris | 257/686 |
| 5,838,060 A | | 11/1998 | Comer | 257/685 |
| 6,052,284 A | | 4/2000 | Suga et al. | 361/699 |
| 6,165,596 A | | 12/2000 | Chen et al. | 428/209 |
| 6,208,517 B1 | * | 3/2001 | Prince et al. | 361/704 |
| 6,271,058 B1 | * | 8/2001 | Yoshida | 438/108 |

OTHER PUBLICATIONS

"Thermally Conductive Adhesive" MD–140, Thermoset, Lord chemical Products, Dec. 11, 2000, three pages.

MicroNews, Fourth Quarter 1999, vol. 5, No. 4, "Rapid Cure Encapsulant for Use In Ceramic Chip–Carrier Applications", Lombardi et al, eight pages.

* cited by examiner

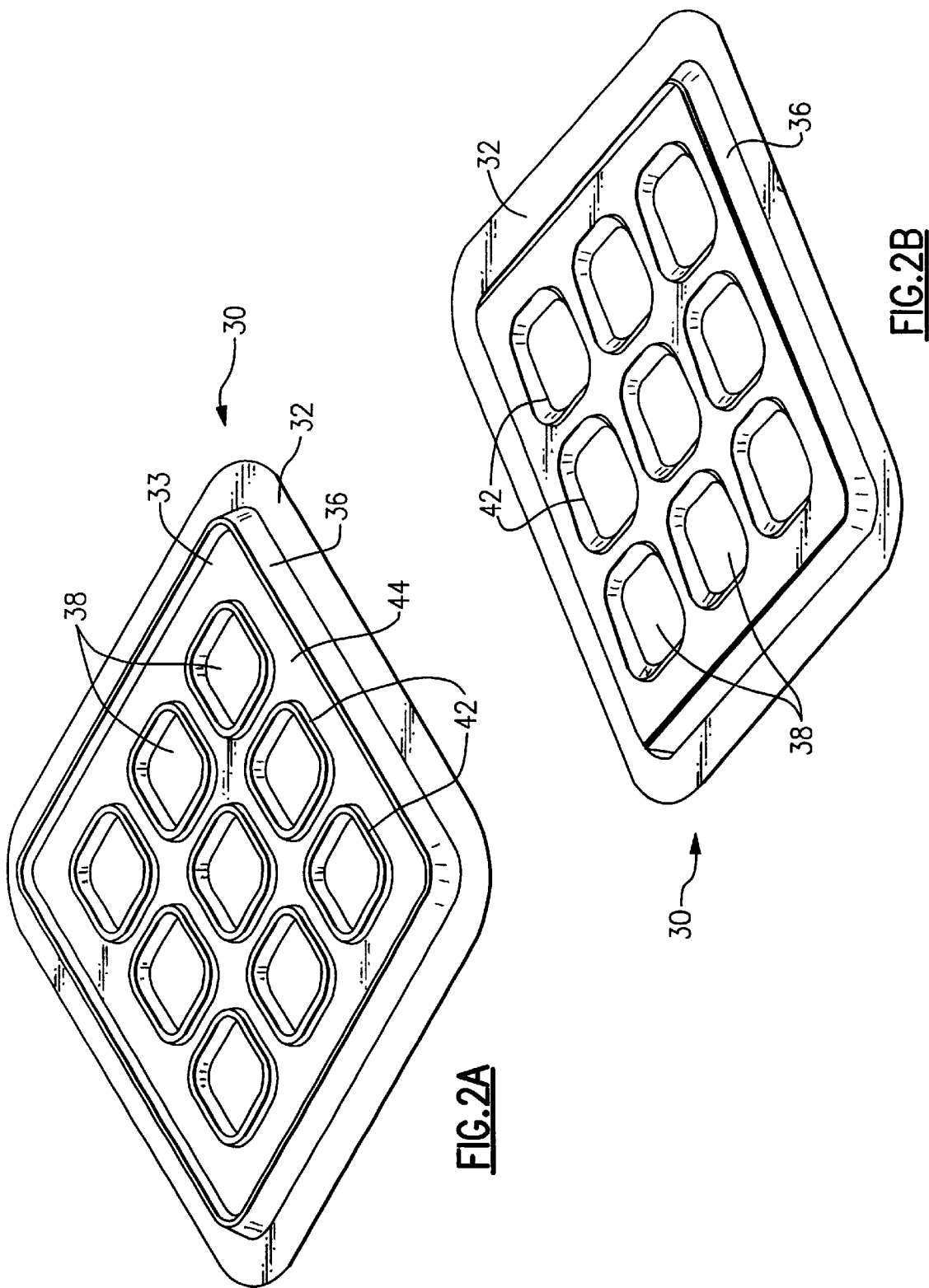

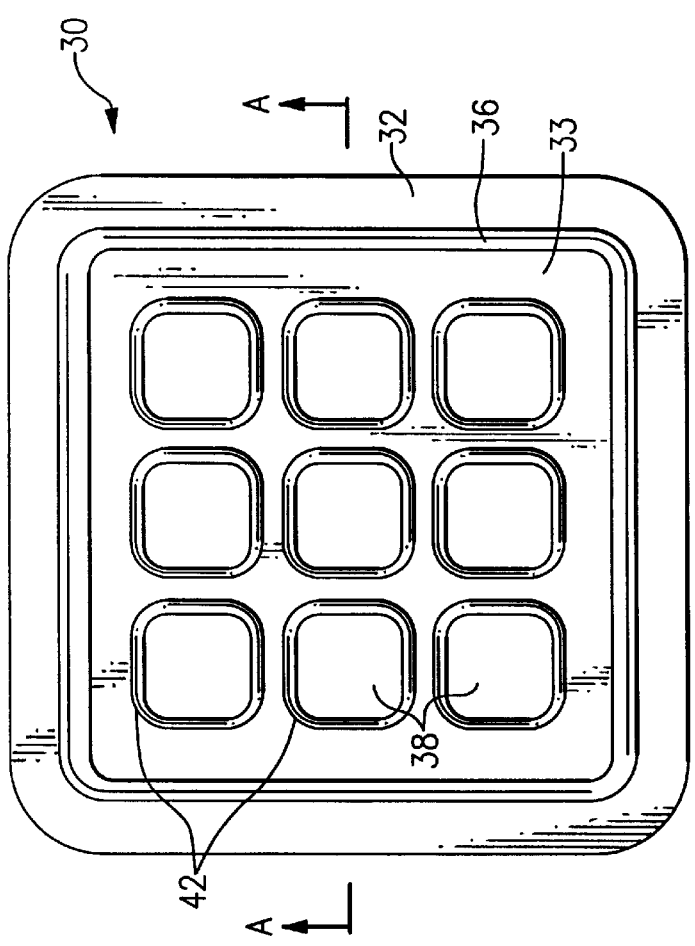
FIG.3A
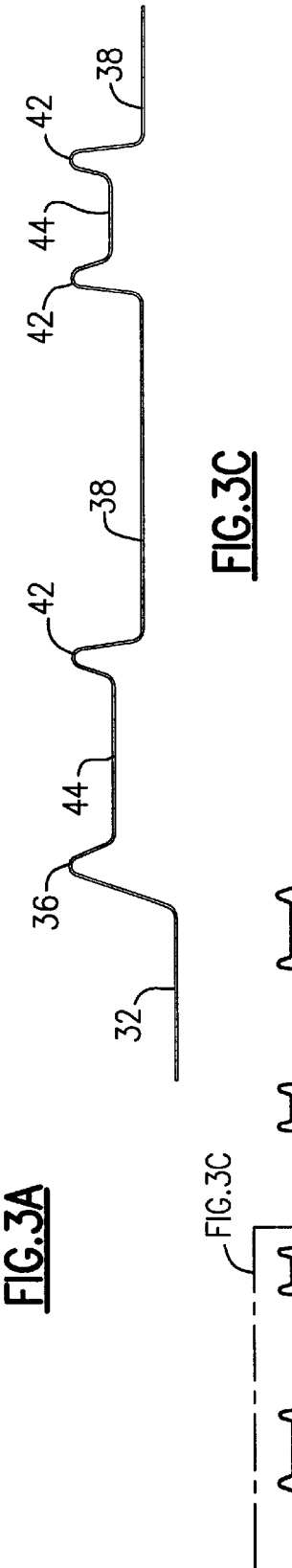
FIG.3B
FIG.3C

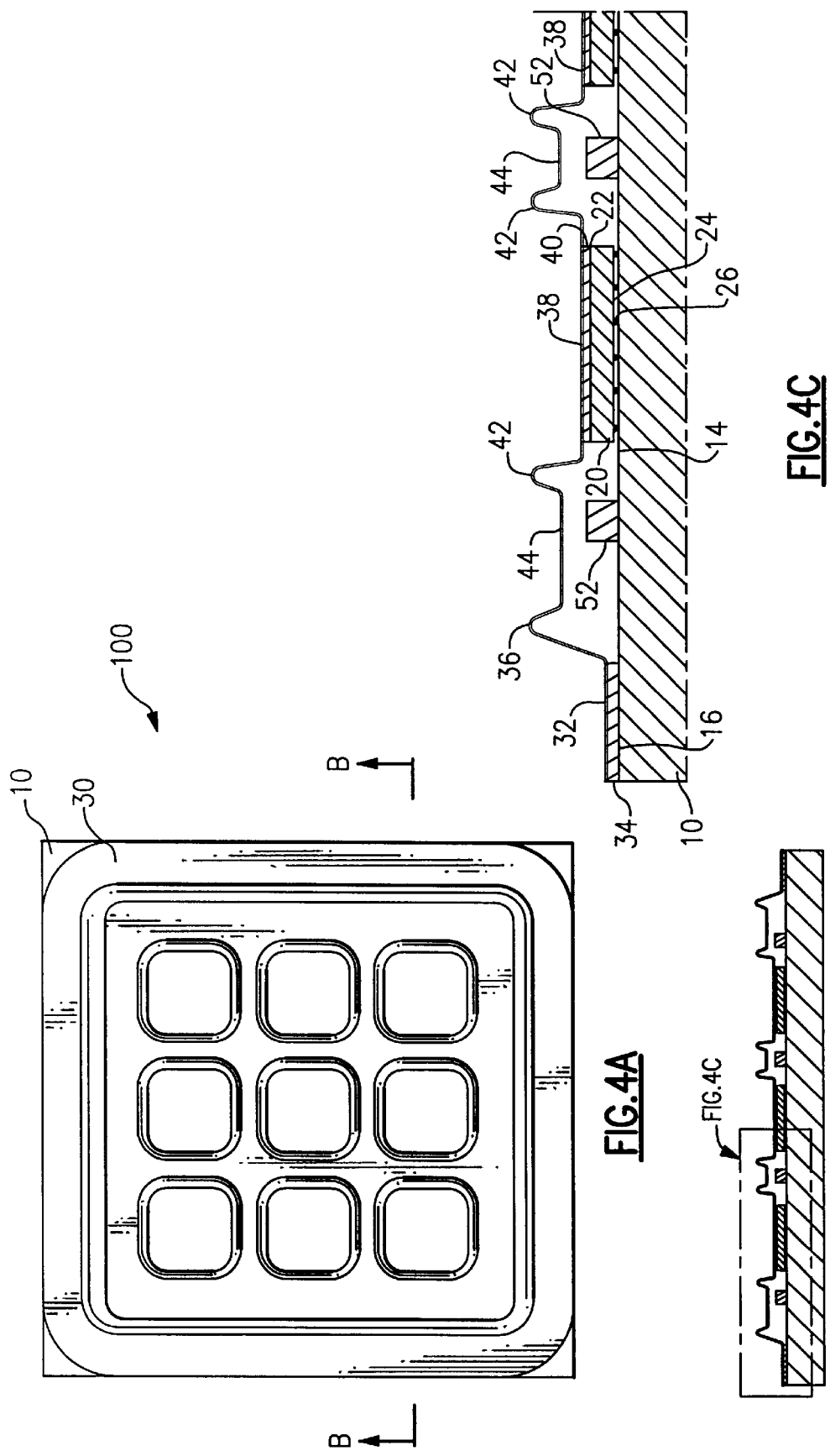

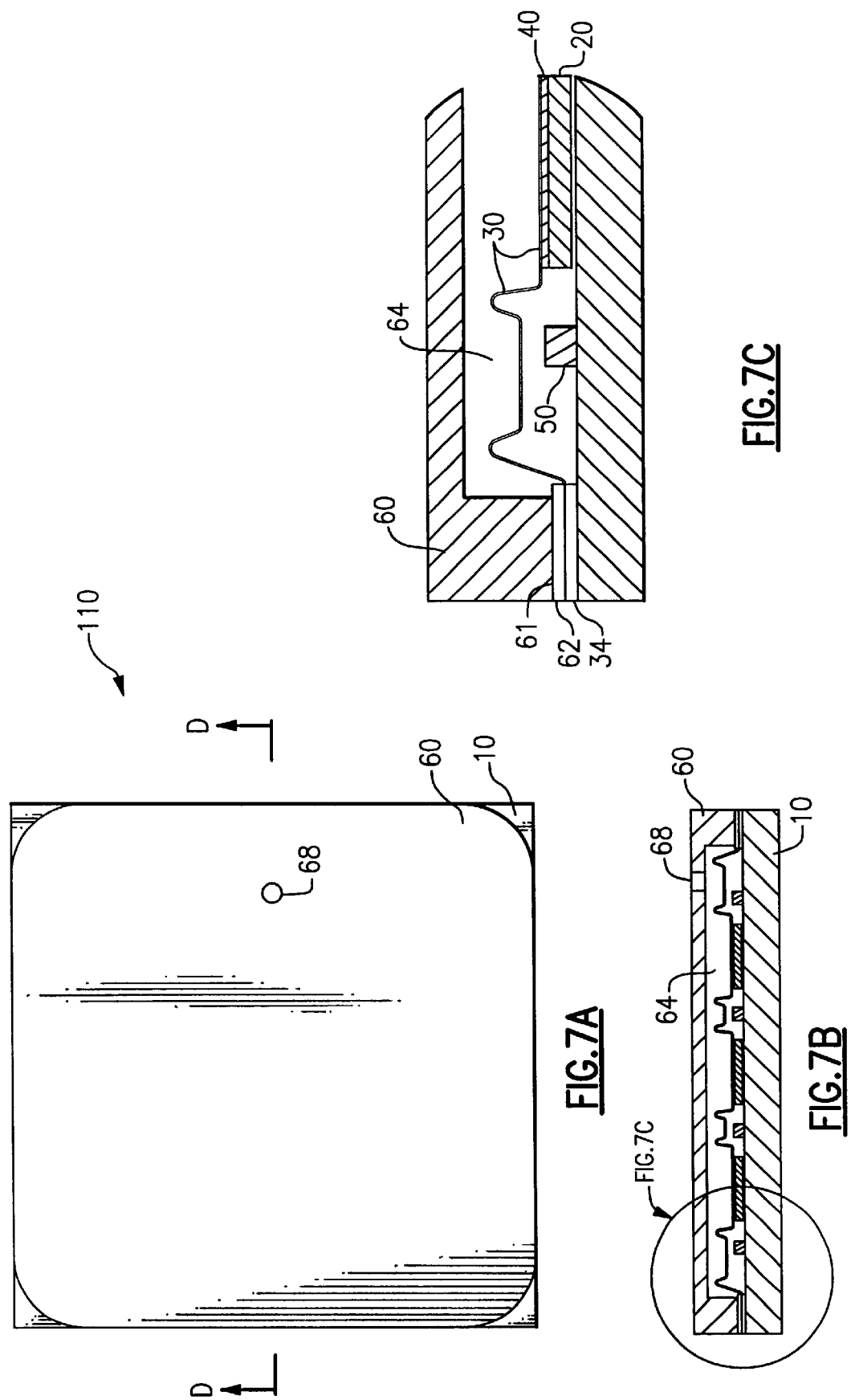

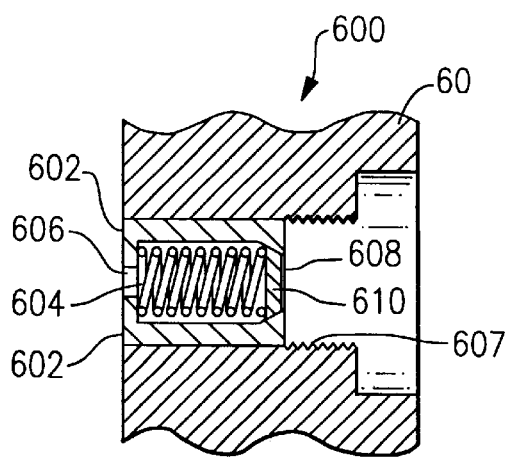
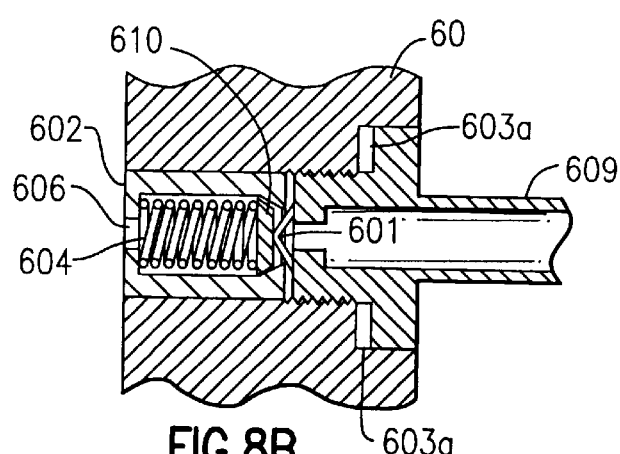
FIG.8A   FIG.8B
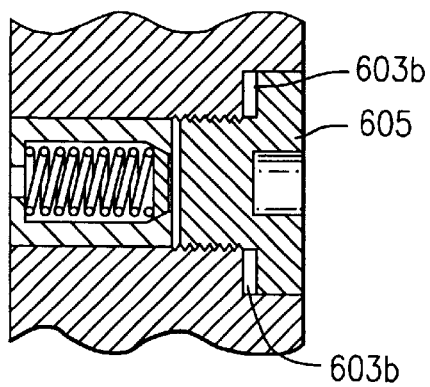
FIG.8C

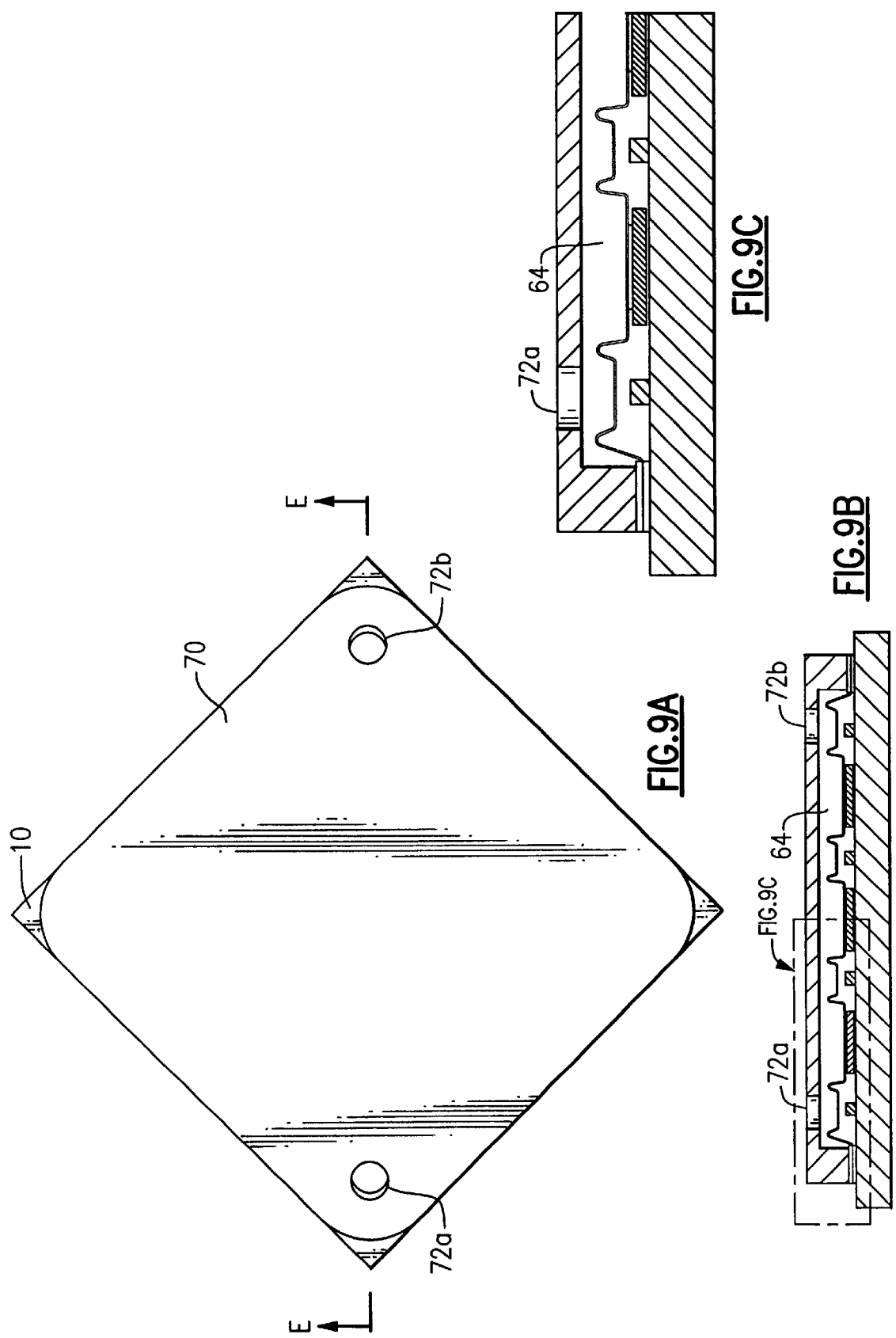

ELECTRONIC DEVICE SUBSTRATE ASSEMBLY WITH IMPERMEABLE BARRIER AND METHOD OF MAKING

CROSS REFERENCE TO RELATED APPLICATIONS

This application contains subject matter which is related to the subject matter of the following applications, each of which is assigned to the same assignee as this application and each of which is hereby incorporated herein by reference in its entirety:

"Enhanced Air Cooling of Electronic Devices using Fluid Phase Change Heat Transfer," Chu et al., Ser. No. 10/040680, co-filed herewith.

FIELD OF THE INVENTION

The present invention relates in general to devices used for removing heat from electronic modules, and methods of constructing such devices. In particular, the present invention relates to an apparatus for passivating an electronic module substrate assembly by preventing contact between a cooling fluid and the electronics to be cooled while providing a high thermal conductivity path between the electronics to be cooled and the cooling fluid.

BACKGROUND OF THE INVENTION

As is known, operating electronic devices produce heat. This heat should be removed from the devices in order to maintain device junction temperatures within desirable limits: failure to remove the heat thus produced results in increased device temperatures, potentially leading to thermal runaway conditions. Several trends in the electronics industry have combined to increase the importance of thermal management, including heat removal for electronic devices, including technologies where thermal management has traditionally been less of a concern, such as CMOS. In particular, the need for faster and more densely packed circuits has had a direct impact on the importance of thermal management. First, power dissipation, and therefore heat production, increases as the device operating frequencies increase. Second, increased operating frequencies may be possible at lower device junction temperatures. Finally, as more and more devices are packed onto a single chip, power density (Watts/cm$^2$) increases, resulting in the need to remove more power from a given size chip or module. These trends have combined to create applications where it is no longer desirable to remove the heat from modern devices solely by traditional air cooling methods, such as by using traditional air cooled heat sinks. These trends are likely to continue in the foreseeable future, furthering the need for alternatives to traditional air cooling methods.

One approach to avoiding the limitations of traditional air cooling is to use a cooling fluid. As is known, different fluids provide different cooling capabilities. In particular, fluids such as refrigerants or other dielectric fluids exhibit relatively poor thermal conductivity and specific heat properties, when compared to fluids such as water or other aqueous fluids. Dielectric fluids have an advantage, however, in that they may be placed in direct physical contact with electronic devices and interconnects without adverse affects such as corrosion or electrical short circuits. For example, U.S. Pat. No. 6,052,284, entitled "Printed Circuit Board with Electronic Devices Mounted Thereon," describes an apparatus in which a dielectric fluid flows over and around several operating electronic devices, thereby removing heat from the devices.

Other cooling fluids, such as water or other aqueous fluids, exhibit superior thermal conductivity and specific heat compared to dielectric fluids. Water-based coolants, however, must be kept from physical contact with electronic devices and interconnects, since corrosion and electrical short circuit problems are likely to result from such contact. Various methods have been disclosed for using water-based coolants, while providing physical separation between the coolant and the electronic devices. For example, U.S. Pat. No. 4,531,146, entitled "Apparatus for Cooling High-Density Integrated Circuit Packages," discloses the use of a conductive foil barrier; U.S. Pat. No. 4,879,629, entitled "Liquid Cooled Multi-chip Integrated Circuit Module Incorporating a Seamless Compliant Member for Leakproof Operation," and IBM Technical Disclosure Bulletin Vol. 20, No. 2, July 1977, entitled "Liquid Cooled Module with Compliant Membrane," disclose the use of a flexible barrier with thermal conduction enhancements (thermal studs and heatsinks, respectively); and U.S. Pat. No. 4,381,032, entitled "Apparatus for Cooling High-Density Integrated Circuit Packages," and U.S. Pat. No. 5,294,830, entitled "Apparatus for Indirect Impingement Cooling of Integrated Circuit Chips," disclose the use of flexible barriers, where pistons are used to maintain contact between the barrier and the devices to be cooled.

An additional problem may arise with the use of a barrier, where the barrier material differs from any of the other materials used to construct the electronic module assembly. While solids in general tend to expand with increasing temperature, the rate of expansion for a given temperature change tends to be characteristic of a particular material. This characteristic, known as the thermal coefficient of expansion, varies from material to material. Therefore, two structures of different materials, when bonded together at one temperature, will tend to expand at different rates as the temperature of the two materials increases. This difference in expansion rates results in mechanical stresses in the structure, as the temperature of the structure varies in either direction from the temperature at which the devices were bonded (zero stress condition). It is desirable, therefore, for a device employing a coiling fluid barrier to provide a stress relief mechanism in order to relieve stresses produced within permanently bonded structures composed of materials having different thermal coefficients of expansion.

For the foregoing reasons, therefore, there is a need in the art for a device capable of providing a high thermal conductivity path between a device to be cooled and a water-based coolant, while simultaneously maintaining physical separation between the coolant and electronic devices and providing relief from mechanical stresses caused by mismatches in the thermal coefficients of expansion of various materials within the device assembly.

SUMMARY

The present invention is directed to a device capable of providing a high thermal conductivity path between a device to be cooled and a water-based coolant, while simultaneously maintaining physical separation between the coolant and electronic devices and providing relief from mechanical stresses caused by mismatches in the thermal coefficients of expansion of various materials within the device assembly.

In one aspect of the present invention, an electronic module substrate assembly is disclosed, including a substrate, an electronic device which is electrically connected to the substrate, and a metal barrier. The substrate includes a periphery. The metal barrier includes a perimeter area which is sealably affixed to the substrate periphery; at least one fold to accommodate thermal expansion; and a device contact area which is thermally coupled to an upper surface of the electronic device.

In another aspect of the present invention, an electronic module assembly is disclosed, including a substrate, an electronic device which is electrically connected to the substrate, and a metal barrier. The substrate includes a periphery. The metal barrier includes a perimeter area which is sealably affixed to the substrate periphery; at least one fold to accommodate thermal expansion; and a device contact area which is thermally coupled to an upper surface of the electronic device. The electronic module assembly further includes a module cap sealably affixed to the upper surface of the barrier perimeter area, the module cap inner surface and the barrier upper surface thereby defining an internal volume capable of containing a cooling fluid.

In yet another aspect of the present invention, a method of fabricating a passivated electronic module substrate assembly is disclosed. The substrate assembly includes a substrate and at least one electronic device. The substrate includes a perimeter area. The method includes: sealably affixing a metal barrier to the substrate perimeter area, where the metal barrier includes at least one fold to accommodate thermal expansion; thermally coupling the metal barrier to at least one electronic device.

It is therefore an object of the present invention to provide a passivated electronic module substrate assembly. It is a further object of the present invention to passivate an electronic module assembly by providing a thermally conductive barrier, thermally coupled to at least one electronic device. It is a further object of the present invention to provide relief from mechanical stresses caused by mismatches in thermal coefficients of expansion by using a folded barrier.

The recitation herein of a list of desirable objects which are met by various embodiments of the present invention is not meant to imply or suggest that any or all of these objects are present as essential features, either individually or collectively, in the most general embodiment of the present invention or in any of its more specific embodiments.

BRIEF DESCRIPTION OF THE DRAWINGS

The subject matter which is regarded as the invention is particularly pointed out and distinctly claimed in the concluding portion of the specification. The invention, however, both as to organization and method of practice, together with further objects and advantages thereof, may best be understood by reference to the following description taken in connection with the accompanying drawings in which:

FIG. 2A is a top isometric view of a passivation barrier per an embodiment of the present invention;

FIG. 2B is a bottom isometric view of the passivation barrier depicted in FIG. 2A;

FIG. 3A is a plan view of the passivation barrier depicted in FIGS. 2;

FIG. 3B is a cross-sectional cut of the passivation barrier depicted in FIG. 3A taken along lines A—A;

FIG. 3C is a detail view of a portion of the cross section depicted in FIG. 3B;

FIG. 4A is plan view of a passivated electronic module assembly per one embodiment of the present invention;

FIG. 4B is a sectional cut of the passivated electronic module assembly depicted in FIG. 4A taken along lines B—B;

FIG. 4C is a detail view of a portion of the cross section depicted in FIG. 4B;

FIG. 7A is a plan view of a module assembly per an embodiment of the present invention;

FIG. 7B is a cross-sectional cut of the module assembly depicted in FIG. 7A taken along line D—D;

FIG. 7C is a detail view of a portion of the cross section depicted in FIG. 7B;

FIG. 8A depicts a filling valve per an embodiment of the present invention;

FIG. 8B depicts the filling valve of FIG. 8A during introduction of cooling fluid, per an embodiment of the present invention;

FIG. 8C depicts the filling valve of FIG. 8A after sealing, per an embodiment of the present invention;

FIG. 9A is a plan view of a module assembly including fluid ports per an embodiment of the present invention;

FIG. 9B is a cross-sectional cut of the module assembly depicted in FIG. 9A taken along line E—E;

FIG. 9C is a detail view of a portion of the cross section depicted in FIG. 9B.

DETAILED DESCRIPTION OF THE INVENTION

In accordance with preferred embodiments of the present invention, provided herein is a passivated electronic substrate assembly. The substrate assembly includes a substrate and at least one electronic device to be cooled, which is electrically connected to the substrate. The passivated substrate assembly further includes a thin, impermeable, thermally conductive metal barrier, bonded to at least two surfaces. The barrier perimeter is bonded to the substrate perimeter, forming a liquid tight seal. At least one device contact area of the barrier, within a central area of the barrier, is bonded to a device to be cooled. The barrier further includes at least one fold, relieving stress created by mismatches in thermal coefficients of expansion between devices within the passivated electronic module assembly.

Substrate Assembly Overview

Figure 1:
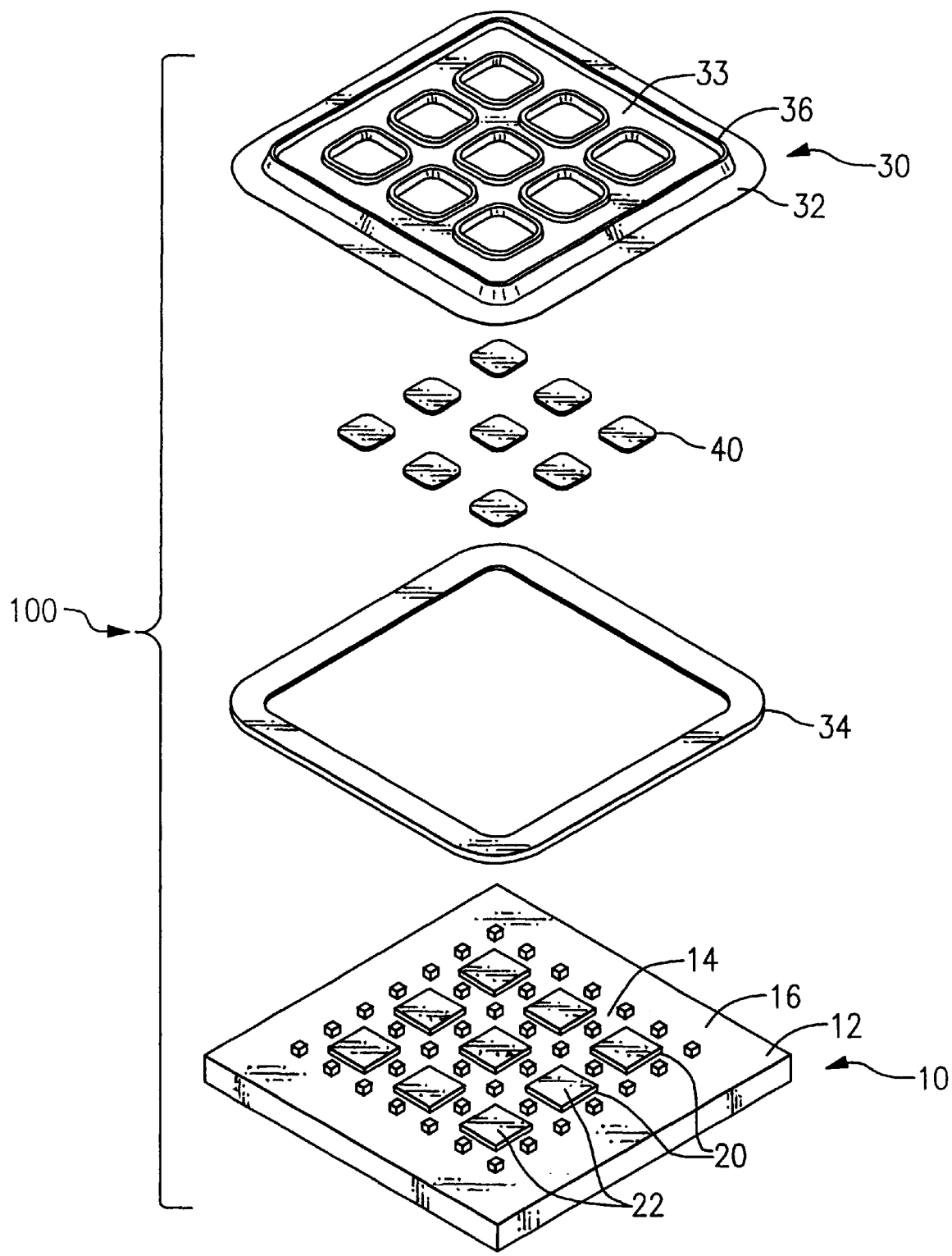
FIG. 1 is an exploded view illustrating an electronic module substrate and a passivation barrier per an embodiment of the present invention.
Figure 5B:
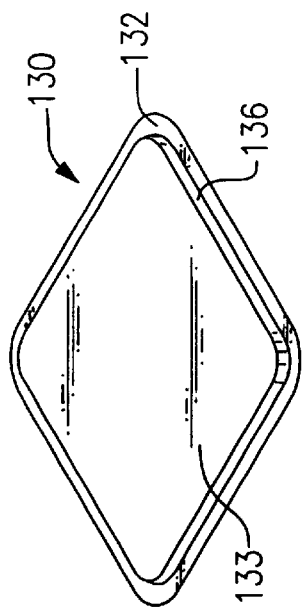
FIG. 5B depicts an isometric view of the barrier illustrated in FIG. 5A.
Figure 5D:
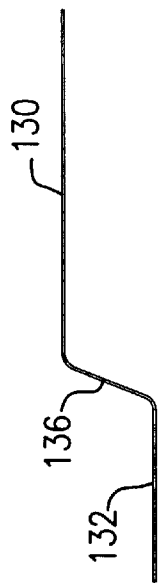
FIG. 5D depicts a detail view of a portion of the cross section depicted in FIG. 5C.
Figure 5A:
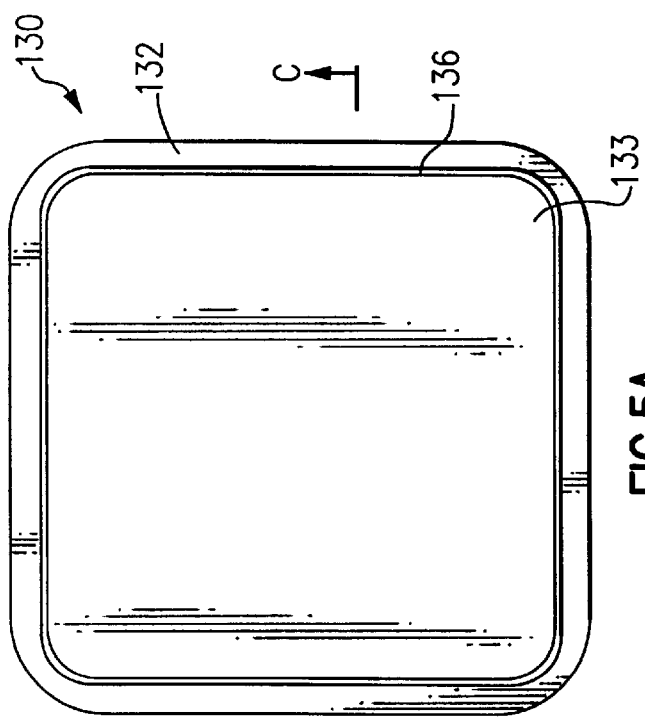
FIG. 5A depicts a plan view of an alternative barrier using a single fold, per another embodiment of the present invention.
Figure 5C:
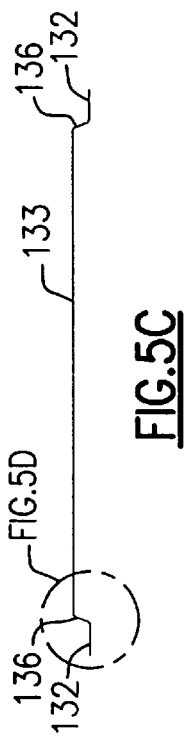
FIG. 5C depicts a cross-sectional cut of the barrier depicted in FIG. 5A taken along lines C—C.

FIG. 1 depicts one embodiment of an electronic module substrate assembly 100, comprised of electronic device substrate 10, and passivation barrier 30, perimeter bonding substance 34, and device bonding substance 40. Substrate 10 includes a first or upper surface 12. Substrate first surface 12 includes inner or central area 14, and perimeter area 16. The relative dimensions of central area 14 and perimeter area 16 may differ from those shown in the exemplary embodiment of FIG. 1, in keeping with the spirit and scope of the present invention. Substrate 10 is comprised of materials as known in the art, such as ceramic, glass ceramic, etc. Substrate assembly 100 further includes at least one electronic device 20, electrically connected to central area 14 of substrate 10 first surface 12. Although the embodiment shown in FIG. 1 illustrates a substrate assembly having a plurality of electronic devices 20, the methods of the present invention are in no way limited to any specific number of electronic devices 20. In fact, the methods of the present invention may be applied to an electronic assembly having a single device 20, and may further be applied to assemblies having dozens or even hundreds of devices 20.

Substrate central area 14 generally performs two functions: it provides the mechanical and electrical connections to one or more electronic devices 20, and further provides at least one layer of electrical connections between electronic devices 20 and other electronic devices 20 or external devices. In furtherance of these functions, substrate central area 14 generally includes one or more connection locations or chipsites (not visible, underlying devices 20), one for each device 20 to be connected to central area 14. Furthermore, substrate central area 14 also generally includes electrical connections between devices 20. Contact between either of these regions (chipsites or interconnects) and an electrically conductive material (such as a metal film or an aqueous fluid) is likely to result in undesirable electrical short circuits. Furthermore, contact between either of these regions and an aqueous fluid may lead to corrosion of the electrical contacts and conductors, which is also an undesirable situation.

Substrate perimeter area 16 includes neither device 20 connection or electrical interconnection functions as found in substrate central area 14, and therefore does not contain chipsites, electrical interconnections, or electronic devices 20. Contact between perimeter area 16 and a conductive material (such as metal or an aqueous solution) does not result in the electrical short circuit or corrosion problems that would result from contact with central area 14.

As previously noted, substrate assembly 100 includes at least one electronic device 20, and may include one or hundreds of devices 20. Device 20 further includes upper surface 22, which generally corresponds to the back side of a semiconductor chip. Other embodiments are envisioned, however, where device 20 is a packaged electronic device rather than an unpackaged semiconductor chip, and surface 22 is therefore an upper surface of the packaged device 20. While preferred embodiments of the present invention employ a substantially flat surface 22, the methods of the present invention apply to other surface structures, such as curved (convex or concave), rough, or irregular surfaces, provided that surface 22 is not discontinuous at a macroscopic level. Furthermore, the methods of the present invention do not require absolutely parallel alignment between device upper surface 22 and substrate first surface 12, nor do the methods of the present invention require precise alignment between surface 22 of one device 20 and surface 22 of any other device 20. In general, the methods of the present invention apply even in the presence of relatively minor imperfections such as defects, curvature, and tilting of surface 22. A relatively minor imperfection is one that does not substantially impair the thermal bond between device upper surface 22 and device contact area 38, as described in detail herein.

As seen in FIGS. 4B and 4C, device 20 further includes a lower surface 24, terminating in a plurality of electrical connections 26 to substrate central area 14. Connections 26 are preferably controlled collapse chip connects (C4s), however connections 26 may be any suitable electrical connection between device lower surface 24 and central area 14.

FIG. 1 further illustrates barrier 30 in relation to substrate 10. In particular, barrier 30 is positioned over the first surface 12 of substrate 10. Barrier 30 and substrate first surface 12 are similar in shape and size. Barrier 30 includes an outer perimeter area 32, comparable in size and shape to substrate perimeter area 16, and positioned directly above substrate perimeter area 16. Barrier 30 further includes central area 33, likewise comparable in size and shape to substrate central area 14, and positioned directly above substrate central area 14. While the shape and dimensions of corresponding areas of barrier 30 and substrate 10 are comparable, minor differences in shape and size may be tolerated within the spirit and scope of the present invention. A minor difference in shape or dimension is one which does not impair the function of the individual components, or the assembly as a whole.

Barrier Details

With reference now to FIGS. 2 and 3, further details of barrier 30 are described. FIG. 2A illustrates one embodiment of passivation barrier 30, corresponding to the assembly embodiment illustrated in FIG. 1. As seen from the top in FIG. 2A, barrier 30 includes a substantially flat perimeter area 32, forming the outermost region of barrier 30. Inside of and bordering substantially the entire perimeter area 32, barrier 30 includes fold 36. Fold 36 is preferably continuous, however fold 36 may have gaps or discontinuities. Enclosed by fold 36, barrier 30 includes central area 33. Within barrier central area 33, barrier 30 further includes at least one device contact area 38. In the exemplary embodiment of FIG. 2A, nine device contact areas are illustrated, corresponding to the nine devices 20 illustrated on substrate 10 of FIG. 1. Substantially surrounding or circumscribing the at least one device contact area 38, barrier 30 further includes fold 42. Fold 42 is preferably continuous, however fold 42 may have gaps or discontinuities. As previously noted, substrate assembly 100 may include any number of devices 20. Barrier 30 may therefore include any number of device contact areas 38 and associated folds 42. In preferred embodiments, barrier 30 includes one device contact area 38, surrounded by one fold 42, for and associated with each device 20. In general, however, barrier 30 may include more contact areas 38 than devices 20, or fewer contact areas 38 than devices 20, within the spirit and scope of the present invention.

FIG. 2B illustrates the structure of the embodiment of barrier 30 shown in FIG. 2A, as viewed from beneath. FIG. 2B therefore depicts the surfaces that are ultimately attached to substrate perimeter 16, and device 20 upper surface 22. In particular, FIG. 2B depicts a substantially flat perimeter area 32, which is attached to substrate perimeter area 16 in assembly 100. FIG. 2B also depicts several device contact areas 38, which are attached to the upper surfaces 22 of devices 20 in assembly 100. As described herein, regions within barrier 30 generally include an upper surface and a lower surface, each of which may serve different functions. For example, device contact areas 38 include an upper surface as illustrated in FIG. 2A, which may be in contact with a cooling fluid. Device contact areas 38 also include a lower surface as illustrated in FIG. 2B, which is bonded or affixed to device upper surface 22. When describing a bond between device contact area 38 and device upper surface 22, therefore, it is understood that the underside of device contact area 38, as illustrated in FIG. 2B, is bonded or affixed to device upper surface 22. Similarly, barrier perimeter 32 includes an upper surface shown in FIG. 2A, and a lower surface shown in FIG. 2B. When describing a bond between barrier perimeter 32 and substrate perimeter 16, it is understood that the underside of barrier perimeter 32, as shown in FIG. 2B, is bonded to substrate perimeter 16.

Barrier 30 further includes upper plateau area 44 within central area 33. As seen in FIG. 1, central area 14 of substrate 10 generally includes regions with devices 20, and regions devoid of devices 20. Upper plateau area 44 occupies the regions above central area 14 which are devoid of devices 20. Barrier 30 is therefore seen to contain three distinct regions: perimeter 32, perimeter fold 36, and central area 33. Central area 33 is seen to contain three distinct regions: at least one device contact area 38, at least one raised fold 42, and upper plateau 44.

Barrier 30 preferably provides a low thermal resistance path between device 20 and any material in contact with the upper surface of device contact area 38 (such as a cooling fluid). Also, barrier 30 preferably prevents direct contact between devices 20 and any material in contact with the upper surface of barrier 30 (such as a cooling fluid). Preferably, therefore, the material or materials used to form barrier 30 should have high thermal conductivity, and should also be impermeable. In addition, the material should facilitate the formation of a high thermal conductivity bond to a device 20, such as by soldering. Finally, the material should be relatively malleable, thereby enabling the formation of raised folds 36 and 42. Any materials meeting these requirements may be used to form barrier 30, and are therefore within the spirit and scope of the present invention. In particular, metals such as copper, titanium, aluminum, stainless steel, molybdenum, and alloys thereof, exhibit suitable characteristics for barrier 30. Of these materials, copper and titanium appear to offer superior overall characteristics.

Barrier 30 may be formed of copper. If a copper barrier 30 is to be placed in contact with water or other aqueous fluid, steps should be taken to inhibit corrosion. For example, forming a nonconductive thin film over the surface of copper barrier 30 breaks the galvanic circuit formed when an aqueous fluid contacts copper; thereby eliminating corrosion of copper barrier 30. Such a nonconductive film may be formed, for example, by dipping the copper barrier 30 into a solution of benzotriazole (BTA) and water, at a concentration in the range of 100 ppm BTA. Copper is malleable and a good conductor of heat, making it easy to form and providing a good thermal path between device 20 and a cooling fluid in contact with the upper surface of barrier 30. A copper barrier 30 may be formed by either stamping or electroforming, as discussed in detail herein. In applications where a springy barrier 30 is advantageous, such as where a compressive force is to be applied only to the perimeter regions during assembly and bonding, one of the age-hardened copper alloys may be used to form barrier 30.

Barrier 30 may alternatively be formed of titanium. Titanium is resistant to corrosion, therefore a titanium barrier 30 does not require a corrosion inhibitive film. Titanium is also malleable, and may be formed into barrier 30 by stamping. An alternative method of forming a titanium barrier 30 involves depositing a layer of titanium over a form or mold, and subsequently removing the formed titanium barrier 30 from the mold. Deposition methods known in the art, such as physical vapor deposition, sputtering, or ion vapor deposition, may be used to deposit titanium on the mold. Titanium does not conduct heat as well as copper, however, and a titanium barrier 30 therefore provides a poorer thermal path between device 20 and a cooling fluid in contact with the upper surface of barrier 30, compared to a copper barrier 30.

An additional consideration in selecting a material from which to form barrier 30 is the thermal coefficient of expansion (TCE) of the barrier material with respect to the TCE of the substrate material. While the methods of the present invention (namely the folds 36 and 42) provide relief from stresses caused by mismatches in the TCE's of barrier 30 and substrate 10, minimizing the TCE mismatch and thereby minimizing the resulting stresses might be a design consideration in some applications. Table 1 below illustrates the TCE's for a typical substrate material (i.e. glass-ceramic), silicon, copper, and titanium. From the TCE values shown in Table 1, it can be seen that the TCE of a glass-ceramic substrate and the silicon devices attached thereto most closely match the TCE of titanium.

Alternatively, barrier 30 may be a composite or layered structure, formed of multiple sheets or layers of different materials. For example, barrier 30 may be composed of a relatively thick layer of copper, with a relatively thin layer of a corrosion resistant material, such as chrome, deposited on the upper surface. Or barrier 30 may be composed of a lower layer of copper, followed by an upper layer of aluminum. In this Cu/Al structure, since copper is more noble than aluminum, the aluminum layer acts as a sacrificial anode, thereby protecting the copper layer from corrosion. Other such combinations apparent to one of ordinary skill in the art are within the spirit and scope of the present invention.

TABLE 1

| Material | Thermal Coefficient of Expansion (TCE)* |
| --- | --- |
| Substrate (glass-ceramic) | 3–4 |
| Silicon devices | 2.6 |
| Copper | 16.5 |
| Titanium | 8.5 |

*TCE values provided in microns/meter-K

Barrier 30 may be of various thicknesses, however due to practical considerations, barrier 30 is preferably neither too thick nor too thin. In particular, barrier 30 is preferably continuous throughout, without seams, breaks, or pinholes through which a cooling fluid might pass. While barrier 30 may in theory be quite thin, practical considerations make it desirable for barrier 30 to be thicker than some practical minimum, typically at least 1 mil thick. Furthermore, while barrier 30 may in theory be quite thick, practical considerations make it desirable for barrier 30 to be thinner than some practical maximum, no more than several mils thick. In particular, it may be more difficult to form the raised folds 36 and 42 in a thicker barrier 30. Furthermore, as the thickness of barrier 30 increases, so does the thermal resistance of the path between device 20 and a cooling fluid in contact with the upper surface of contact area 38. Therefore, while barrier 30 may in theory be of a range of thicknesses, practical considerations suggest that barrier 30 thickness is preferably in the range of from approximately 1 mil to approximately 3 mils.

FIGS. 3A through 3C depict additional details of barrier 30, per an embodiment of the present invention. FIG. 3A depicts a top view of the barrier 30 shown in FIGS. 1 and 2. FIG. 3B depicts a cross sectional view of the barrier 30 shown in FIG. 3A, taken at line A—A. FIG. 3C depicts a detail view of the circled portion of FIG. 3B.

With reference now to FIGS. 3C and 4C, the topology of an embodiment of barrier 30 is described. Beginning at the leftmost portion of FIG. 3C, barrier perimeter area 32 is seen to be substantially flat. As illustrated in FIG. 4C, barrier perimeter area 32 is affixed to substrate 10 perimeter area 16. A bonding material 34 is used to affix and seal barrier perimeter 32 to substrate perimeter 16. Bonding material 34 may be any suitable material, such as epoxy, solder, or a gasket. Since no appreciable heat transfer takes place at the barrier perimeter 32 and substrate perimeter 16 bond, the thermal characteristics of bonding material 34 are not critical. In some applications, bonding material 34 may be required to form a hermetic seal, to prevent oxygen from contacting device 20 or substrate 10 thereby causing corrosion. In applications employing an appropriate corrosion inhibitor or encapsulant, bonding material 34 need not provide a hermetic seal. Appropriate encapsulants are described in U.S. Pat. No. 5,656,862, entitled "Solder Interconnection Structure," and U.S. Pat. No. 5,668,059, entitled "Solder Interconnection Structure and Process for Making," each of which is assigned to the same assignee as the present application and each of which is hereby incorporated herein by reference in its entirety.

With reference again to FIG. 3C, raised fold 36 is seen to the right of barrier perimeter area 32. As seen in FIG. 3A, raised fold 36 surrounds or circumscribes barrier central area 33. FIG. 3C next depicts plateau region 44 between raised folds 36 and 42, marking the start of barrier central area 33. Plateau 44 is the upper plateau region of barrier central area 33, which is positioned above areas of substrate central area 14 that are devoid of devices 20. FIG. 3C next depicts raised fold 42, which FIG. 3A shows circumscribing device contact area 38. FIG. 3C next depicts device contact area 38, also a plateau region, but at a lower height than the upper plateau region 44 between folds 36 and 42. Continuing toward the right in FIG. 3C, raised fold 42 is again depicted on the right side of device contact area 38. The raised folds 42 shown in FIG. 3C to the left and right of device contact area 38, are seen in FIG. 3A to form a closed figure circumscribing device contact area 38 when viewed from above. Again continuing to the right in FIG. 3C, upper plateau region 44 is again depicted between adjacent raised folds 42. Finally, FIG. 3C depicts another raised fold 42 followed by another device contact area 38.

From the foregoing discussion, barrier 30 is seen to contain a number of regions, each possibly at a different height above substrate 10. The outermost region, barrier perimeter 32, is affixed to substrate 10. Raised fold 36 defines the border between perimeter 32 and central area 33. Central area 33 comprises the entire region enclosed by raised fold 36. Central area 33 includes three regions, possibly at varying heights: at least one device contact area 38, a raised fold 42 circumscribing each device contact area 38, and an upper plateau region 44 surrounding the device contact areas 38. As seen in FIG. 3C, of the regions within central area 33 raised fold 42 is the highest, device contact area 38 is the lowest, and upper plateau 44 lies between the two in height. As depicted in FIG. 3C, raised fold 36 is slightly higher than raised fold 42. Alternative embodiments are envisioned wherein folds 36 and 42 are substantially the same height, or where fold 42 is higher.

The surface topology of barrier 30 serves several functions. Folds 36 and 42 provide stress relief by allowing barrier 30 to flex laterally, thereby compensating for differences in thermal coefficients of expansion between barrier 30 and either substrate 10 or devices 20. Folds 36 and 42 also provide a plurality of plateau regions, possibly at different heights. The height of each plateau region is determined by the function it performs and the topology of the underlying substrate 10 and devices 20, as is described herein.

Substrate Assembly Details

With reference now to FIGS. 4A through 4C, additional details of an embodiment of assembly 100 are provided. FIG. 4A depicts assembly 100, per an embodiment of the present invention. FIG. 4B depicts a cross-sectional view of the embodiment shown in FIG. 4A, taken at line B—B. FIG. 4C depicts a detail view of the region of FIG. 4B enclosed within the rectangle. In particular, FIG. 4C depicts how the topology of barrier 30 relates to the underlying structure of substrate 10 and devices attached thereto. As previously noted, barrier perimeter 32 is bonded to substrate perimeter 16, with bonding substance 34. As depicted in FIG. 4C, device contact area 38 is bonded to device 20 upper surface 22, using bonding substance 40. Unlike the barrier and substrate perimeter bond, the bond between device upper surface 22 and device contact area 38 preferably provides a high thermal conductivity path from device 20 to a cooling fluid in contact with the upper surface of device contact area 38. Also unlike the perimeter bond, since a cooling fluid in contact with the upper surface of barrier 30 is, by design, unlikely to come into contact with bonding substance 40, the permeability or hermeticity of the bond formed by bonding substance 40 is not critical. Ideally, bonding substance 40 is a relatively low temperature solder, with a melting point below 220° C., such as a lead-tin eutectic solder which melts at 183° C. Alternatively, bonding substance 40 is a thermally conductive epoxy such as described herein. While bonding substances 34 and 40 serve different primary functions, and may therefore be different substances, embodiments are envisioned wherein bonding substances 34 and 40 are substantially the same substance. For example, a low temperature solder may be used for both bonding substances 34 and 40. Alternatively, a thermally conductive epoxy may be used for both bonding substances 34 and 40.

With reference again to FIGS. 4B and 4C, device contact area 38 is shown to be wider than device 20, extending beyond the edges of device 20. Alternative embodiments are envisioned wherein contact area 38 is approximately the same shape and size as device 20, or where contact area 38 is somewhat smaller than device 20, all within the spirit and scope of the present invention. Alternative embodiments are also envisioned where a plurality of devices 20 with different dimensions are used: in such embodiments, each contact area 38 within barrier 30 may be of a different size, and may also be of a different shape, and/or at a different height.

FIG. 4C illustrates a factor influencing the relative height of device contact area 38, in relation to the rest of barrier 30's topology. In particular, device contact area 38 is approximately at the same height as device upper surface 22. Alternatively, to facilitate the fabrication process, device contact area 38 may be designed such that, when barrier 30 is not in contact with substrate 10 or devices 20, contact area 38 is slightly lower than the height at which area 38 would normally contact device upper surface 22, thereby creating a compressive force between contact area 38 and device upper surface 22 when a compressive force is applied between the substrate and barrier perimeter areas, 16 and 32, respectively. Alternative embodiments are envisioned where a plurality of devices 20 with different heights are used: in such embodiments, each contact area 38 within barrier 30 may be of a different height.

FIG. 4C further illustrates plateau region 44, which is preferably higher and does not contact substrate 10 or any devices connected to substrate 10. As previously noted, since substrate central area 14 typically contains a plurality of electrical interconnections, contact between a conductor such as barrier 30 and any of the plurality of interconnections within central area 14 is likely to produce undesirable short circuits. As previously noted, one factor influencing the height of plateau region 44 is the desire to avoid undesirable contact between barrier 30 and substrate central area 14.

FIGS. 4B and 4C illustrate another aspect of preferred embodiments of the present invention. Substrate 10 may optionally include one or more passive devices 52, such as resistors or decoupling capacitors (decaps). While these devices are by no means required in any specific embodiments of the present invention, it is seen that the methods of the present invention may be applied to assemblies including passive devices 52. In particular, FIG. 4C depicts passive devices 52 which are taller than device 20. As illustrated in FIG. 4C, upper plateaus 44 are designed such that they remain above passive devices 52. Alternative embodiments are envisioned wherein passive devices 52 are no taller than devices 20, as well as embodiments wherein a plurality of passive devices of varying heights are employed. In embodiments employing passive devices 52 of varying heights, plateau 44 is preferably designed such that it is above the tallest device throughout, thereby preventing contact between barrier 30 and any passive device 52.

Several alternative embodiments are envisioned, within the spirit and scope of the present invention. As previously noted, the teachings of the present invention may be advantageously applied to substrate assemblies including a single device 20, and without a passive device 52. Assemblies 100 having a plurality of devices are also envisioned, wherein devices 20 may be similar or dissimilar. In particular, devices 20 (and upper surfaces 22) may differ in shape, contact area, topology, alignment, orientation, height, packaging (i.e. bare die vs. packaged chips or modules), power dissipation, etc. By varying the size, shape, and height of contact areas 38 in accordance with the specific requirements of a particular design, a wide variety of device combinations may be accommodated using the methods of the present invention. Furthermore, in embodiments including at least one high power device 20 and at least one low power device 20, it may be possible or even desirable to only provide contact area 38 for the high power device.

Another alternative embodiment is envisioned within the spirit and scope of the present invention, as depicted with reference to FIGS. 5A through 5D. FIGS. 5A through 5D illustrate an alternative barrier 130 using a single fold 136 rather than the dual folds 36 and 42 used in barrier 30. In particular, FIGS. 5A through 5D depict barrier 130 having perimeter area 132, fold 136, and central area 133. Absent from central area 133 are the three distinct regions found in central area 33 of barrier 130: device contact area 38, fold 42, and upper plateau 44. In the embodiment of FIGS. 5A through 5D, stresses caused by TCE mismatches are relieved by fold 136. In the embodiment of FIGS. 5A through 5D, all device upper surfaces 22 are bonded to the same region of barrier 130, namely barrier central area 133. The primary advantage of the embodiment depicted in FIGS. 5A through 5D is simplicity: the single fold 136 reduces design complexity, thereby reducing costs. This simplicity does, however, prevent the embodiment of FIGS. 5A through 5D (i.e. barrier 130) from providing two of the advantages of the embodiment illustrated by barrier 30. In particular, barrier 30 includes upper plateau region 44 between devices 20. In embodiments having passive devices 52 which are taller than devices 20, upper plateau region 44 is higher than device contact areas 38, thereby accommodating the taller passive devices. Furthermore, the embodiment illustrated by barrier 30 includes folds 42 surrounding each device 20, thereby providing stress relief within central area 33. This is particularly advantageous in embodiments having a large substrate 10 containing many devices 20: in such embodiments, appreciable stresses may be present in the region between devices 20. For these reasons, the embodiment exemplified by barrier 130 is most advantageously used in applications without passive devices 52, or having only passive devices 52 which are shorter than devices 20, and where stresses due to TCE mismatches within the regions between devices 20 are not a concern, such as in applications using a relatively small substrate 10, or where the TCE of barrier 130 is relatively well matched to that of substrate 10 (such as with a titanium barrier 130 and a glass-ceramic substrate 10).

Module Assembly

Figure 6:
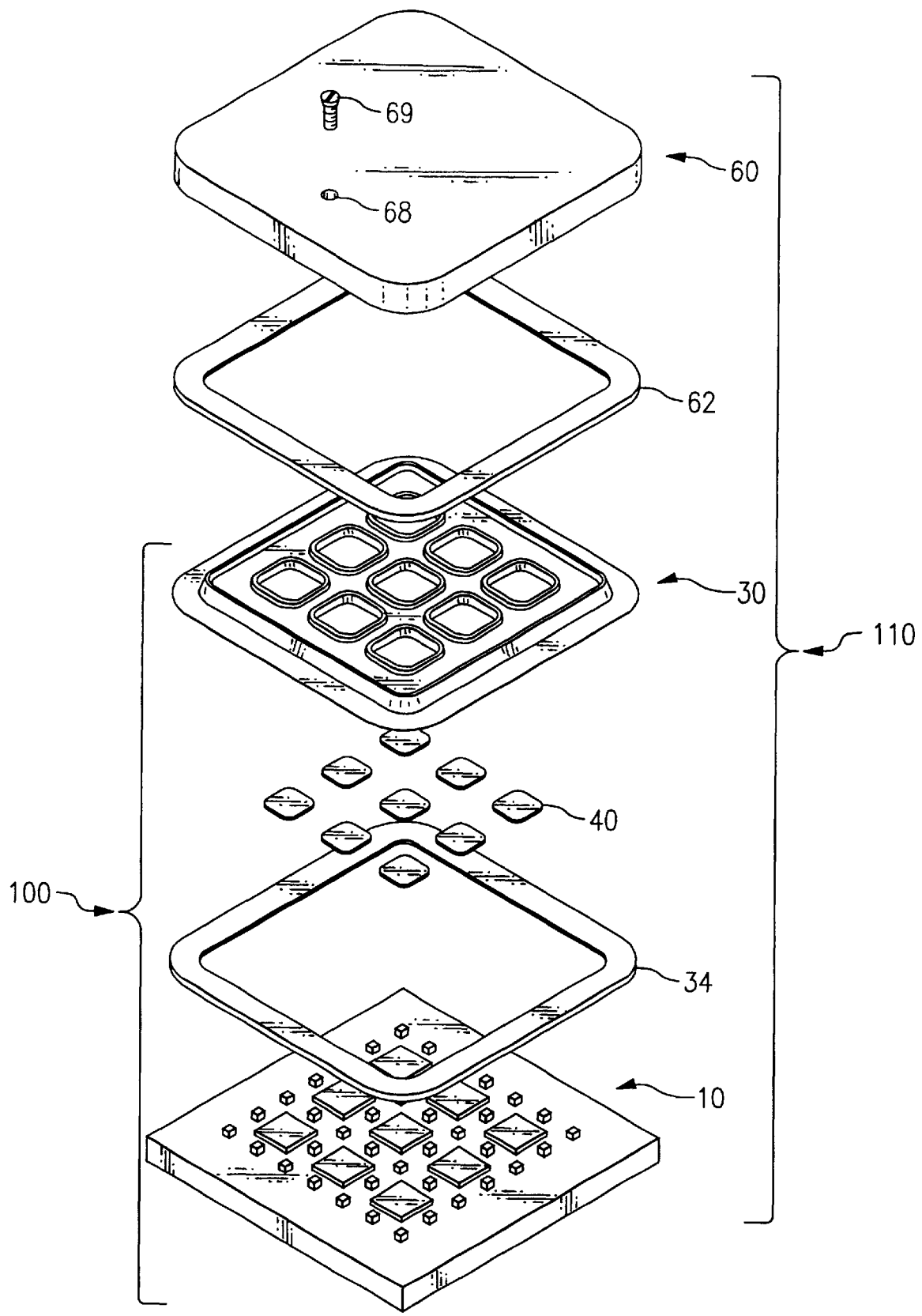
FIG. 6 is an exploded view of an electronic module substrate, passivation barrier, and module cap, per an embodiment of the present invention.

FIGS. 6, 7A, 7B, and 7C illustrate an alternative embodiment of an electronic device employing a passivated substrate assembly, in accordance with the teachings of the present invention. In particular, FIG. 6 illustrates an exploded view of assembly 110, including assembly 100 illustrated in FIG. 1, and further including conductive module cap 60 and cap bonding substance 62. As shown in FIG. 6, the outer edge of cap 60 is substantially the same shape and size as the outermost edge of barrier 30, and is preferably aligned thereto. Bonding substance 62 is substantially the same shape and size as barrier perimeter area 32. Bonding substance 62 preferably provides a fluid-tight, low permeability seal, similar to bonding substance 34. Thermal conduction through the perimeter bond is a secondary consideration, although a good thermal path at the barrier/cap bond is of greater importance than the substrate perimeter to barrier perimeter bond. Any bonding substance that is suitable for use as either bonding substance 34 or bonding substance 40, or both, is therefore suitable for use as bonding substance 62.

FIGS. 7A through 7C illustrate additional details of the embodiment depicted in FIG. 6. FIG. 7A provides a top view, illustrating the similarity in shape and size between the outer edges of substrate 10 and cap 60. FIG. 7C illustrates the relationship between cap 60, bonding material 62, and barrier perimeter 32. In particular, FIG. 7C depicts cap perimeter surface 61, which provides a surface to which bonding material 62 bonds or affixes perimeter area 32. Surface 61 is substantially flat, and preferably no wider than barrier perimeter 32. Preferably and as illustrated in FIG. 7C, cap perimeter 61 is slightly narrower than barrier perimeter 32, in order to avoid contact between cap 60 and barrier 30 other than at barrier perimeter 32.

FIGS. 7B and 7C illustrate another aspect of the embodiment illustrated in FIG. 6. Module cap 60 defines the uppermost and outermost boundaries of enclosed volume 64, the lowermost boundary of the enclosed volume being defined by barrier 30. Bonding material 62 defines the lower portion of the outermost boundary of volume 64, between cap perimeter 61 and barrier 30. Enclosed volume 64 is preferably filled with a cooling fluid. After assembly, fluid inlet 68 may be used to introduce a cooling fluid into volume 64 while allowing gases to escape from volume 64. When a suitable amount of cooling fluid is introduced, sealing device 69 depicted in FIG. 6, such as a threaded bolt, is used to seal inlet 68. Cooling fluids such as water or other aqueous fluids, such as brine, are preferred. Dielectric fluids may also be used, however, the superior thermal conductivity and specific heat of aqueous fluids make aqueous cooling fluids a preferred choice. When volume 64 is thus filled with a cooling fluid, the cooling fluid thus transfers heat from barrier 30 (and hence from device 20) to module cap 60. The primary thermal transfer mechanism in such an embodiment is therefore convection. Various methods as known in the art may be used to cool and/or to remove heat from module cap 60.

In some applications, it may be advantageous to partially fill volume 64 with cooling fluid, at subatmospheric pressure. In such an application, an alternative filling device and method are employed, such as a filling valve. FIGS. 8A through 8C illustrate filling valve 600, which may be used to fill volume 64 with cooling fluid at subatmospheric pressure.

With reference now to FIGS. 8A through 8C, the operation of filling valve 600 is now described. As shown in FIG. 8A, filling valve 600 includes valve body 602, spring 604, module port 606, external port 608, valve seat 610, and threaded casing 607. Threaded casing 607 is a slightly modified version of fill port 68, adapted for valve 600. FIG. 8A depicts valve 600 after final assembly of module 110. In this state, spring 604 presses valve seat 610 against the angled sides of valve body 602, thereby sealing off external port 608. FIG. 8B depicts valve 600 during the process of evacuating air from and introducing fluid into module 110. Filling device 609 includes a threaded portion, engageable with threaded casing 607. Device 609 further includes seal 603a, such as a gasket or O-ring. During the evacuation and fill process, device 609 is threaded into casing 607, engaging seal 603a against module cap 60, thereby creating an air and liquid tight seal. Device 609 includes projection 601, which depresses valve seat 610, thereby opening external port 608. Device 609 should be designed such that seal 603a sealably engages module cap 60 before projection 601 begins to depress valve seat 610. In the position shown in FIG. 8B, a vacuum is applied to device 609, evacuating air from within module 110. While maintaining vacuum, cooling fluid is introduced into module 110, preferably at a pressure below atmospheric pressure. Once the desired pressure of cooling fluid is introduced, device 609 is removed from valve 600, returning valve 600 to the state illustrated in FIG. 8A. During device 609 removal, seal 603a should remain sealably engaged against module cap 60 until valve seat 610 seals external port 608. Finally, plug 605 is inserted into threaded casing 607. Plug 605 includes seal 603b, which sealably engages module cap 60, thereby preventing ingress of ambient air into module 110. Plug 605 and seal 603b provide a higher quality and more permanent seal than the temporary seal provided by valve seat 610.

FIGS. 9A through 9C illustrate another embodiment of an electronic device employing a passivated substrate assembly, in accordance with the teachings of the present invention. In particular, FIG. 9A depicts an alternative cap 70 having two ports 72a and 72b. Ports 72a and 72b are used to provide a flow of fluid through volume 64, thereby increasing the heat removal capability of the assembly. Port 72a serves as an inlet, while port 72b serves as an outlet, both connecting to an external system (not shown) thereby creating a closed loop fluid flow path. The assignment of port 72a as inlet and 72b as outlet is clearly interchangeable. In such an embodiment, a cooling fluid removes heat from barrier 30 by conduction. The temperature of the cooling fluid leaving volume 64 is thus increased in relation to the temperature of cooling fluid entering volume 64. The higher temperature cooling fluid passes through a heat exchanger prior to returning to inlet port 72a for reintroduction into volume 64. Alternative embodiments are envisioned, using: more than two ports, or a plenum arrangement to distribute fluid within volume 64, or using a baffle arrangement within volume 64 to control and direct fluid flow within volume 64. Each of these alternatives may be used alone, or in conjunction with any other combination of alternatives.

Another alternative embodiment which may be advantageously employed to remove heat from a fluid within volume 64 involves partially filling volume 64 with a cooling fluid, allowing the fluid to boil or evaporate, and providing an external condenser connected to ports 72a and 72b, whereby cooling fluid exits volume 64 through outlet port 72b in vapor phase, and returns to volume 64 through inlet port 72a in liquid phase. One such device, using a plurality of ports 72a and a plurality of ports 72b, is described in a co-filed application, Ser. No. 10/040680.

Passivated Substrate Fabrication Methods

Barrier 30 may be formed using a variety of methods. In particular, barrier 30 may be formed by cutting a blank from a continuous sheet of material, then forming folds 36 and 42, and plateaus 38 and 44, by stamping the blank between two conforming molds. This method may be used in any application employing a suitably malleable material (such as copper or titanium) for barrier 30.

Alternative methods may be used to form barrier 30. The specific methods available depend upon the specific material from which barrier 30 is formed. For example, a copper barrier 30 may be formed using an electroforming process as known in the art. Briefly stated, the process of electroforming involves the deposition of a metal film on a form or mandrel, where the deposition is performed by electroplating. Once the deposition is complete, the deposited film is removed from the form or mandrel. Alternatively, a titanium barrier 30 may be formed by depositing a layer of titanium over a mold. Deposition methods such as vapor deposition, sputtering, or ion vapor deposition may be used. Similar alternative deposition methods are available to form barrier 30 using materials such as aluminum, stainless steel, molybdenum, etc., as known in the art.

Once the barrier is formed, a corrosion inhibitor may be applied to barrier 30. As previously discussed, a titanium barrier 30 is corrosion resistant, and therefore does not require a corrosion inhibitor. Copper is susceptible to corrosion when in the presence of an aqueous fluid, and therefore a corrosion inhibitor should be applied, such as the BTA film previously disclosed.

The process of assembling electronic module substrate assembly 100 involves three starting materials: substrate 10, with devices 20 attached thereto; barrier 30, preformed into the various folds and plateaus as previously described; and bonding substances 34 and 40, which may be the same material or different materials, discussed in detail below. These components are illustrated in FIG. 1. Alternative embodiments are envisioned, wherein substrate assembly 100 further includes one or more passive devices 50, as illustrated in FIG. 1.

As discussed with reference to FIGS. 1 through 4C, barrier 30 includes two types of surfaces which are to be bonded to substrate assembly 10: perimeter area 32, and at least one device contact area 38. Substrate assembly 10 includes two types of surfaces which are to be bonded to barrier 30: perimeter area 16 and at least one device upper surface 22. Barrier perimeter 32 is to be bonded to substrate assembly perimeter 16, and each barrier device contact area 38 is to be bonded to one device upper surface 22. Perimeter 32 and perimeter 16 therefore form one pair of bonding surfaces, hereinafter referred to as a perimeter bonding surface pair. In similar fashion, each device upper surface 22 is to be bonded to one barrier device contact area 38: each such pair of bonding surfaces forms a device bonding surface pair. The set of all bonding surface pairs therefore includes the perimeter bonding surface pair(s) and the device bonding surface pair(s). When the embodiment of FIGS. 5A through 5D is used, each device upper surface 22 is bonded to the same surface, namely central area 133.

Regardless of the bonding substance or method used, barrier 30 should be aligned with substrate assembly 10 such that bringing barrier 30 into contact with substrate assembly 10 causes contact between the surfaces within each bonding surface pair. In general, both rotational and lateral alignment should be considered. While embodiments such as that of FIG. 1 exhibit a degree of rotational symmetry (i.e. barrier 30 may be rotated 0, 90, 180, or 270 degrees with respect to substrate 10), other embodiments are envisioned wherein the arrangement of devices 20 upon substrate 10 exhibits no symmetry, thereby allowing only one orientation of barrier 30 with respect to substrate 10. In addition to rotational alignment, lateral alignment should also be considered in order to maximize the effective contact area for device bonding surface pairs, and to improve the seal created by the perimeter bonding surface pair. Appropriate alignment may be accomplished by any method known in the art. For example, in embodiments lacking rotational symmetry, rotational alignment may be accomplished by chamfering one corner of barrier 30 and providing a raised region on a corresponding corner of substrate assembly 10, such that only the chamfered corner of barrier 30 fits within the raised corner region of substrate assembly 10. Lateral alignment may be accomplished by having the edges of barrier 30 terminate flush with the edges of substrate 10 perimeter area 16, and providing an external alignment aid, such as a stop or edge guide, to insure that each edge of barrier 30 is aligned with an edge of substrate 10 perimeter area 16. Regardless of the specific alignment method used, the number and placement of alignment aids should be such that proper engagement of the alignment aids assures both rotational and lateral alignment. As used herein, the term lateral applies to linear measure in either of two orthogonal dimensions, parallel to the plane of substrate 10.

A variety of bonding substances may be used to bond barrier 30 to substrate 10 and device upper surfaces 22. In general, there are two classes of bonding surface pairs: perimeter and device. As previously noted, the bonds formed between these bonding surface pairs have different functions, and therefore place different demands upon the bonding substances used within each class of bonding surface pairs. In particular, the function of the perimeter bonding surface pair is to prevent a cooling fluid from entering the region containing devices 20, which lies between barrier 30 underside and substrate upper surface 12. Since minimal heat transfer takes place through this perimeter bond, the thermal properties of the perimeter bonding substance 34 are less important than the permeability of the perimeter bond. In contrast, the primary function of bonding substance 40, used to bond the device bonding surface pairs, is heat transfer. As a result of these functional differences, different materials may be used as bonding substances 34 and 40.

Bonding substance 40 is preferably either low temperature solder, or a thermally conductive epoxy. Solder is preferred, due to the superior thermal transfer characteristics of a soldered bond. A low temperature solder is preferred, such as lead-tin eutectic, which reflows at 183° C. Solders having higher reflow temperatures may be used, however the solder reflow temperature must remain below the melting temperature of device interconnects 26. For embodiments using C4s as device interconnects 26, this melting temperature is 320° C. For other interconnects, including packaged devices, this temperature may be in the range of 220° C. or lower. Alternatively, bonding substance 40 may be a thermally conductive epoxy. Any two part epoxy as known in the art is sufficient. Since polymers such as epoxies are generally poor conductors of heat, enhanced thermal conductivity is accomplished through the introduction of conductive particles into the epoxy. Conductive particles such as silver or aluminum nitride may be mixed with either the base or curing agent of the epoxy prior to combining base and curing agent. Mixing conductive particles with the base is preferred. Alternatively, a commercially available, thermally conductive epoxy may be used, such as a silver-filled thermally conductive adhesive sold under the trademark THERMOSET MD-140.

Bonding substance 34 is preferably either a low temperature solder, an epoxy, or a gasket. Solder similar to the solder used as bonding substance 40 may be used. The reflow temperature constraints discussed with respect to bonding substance 34 apply to bonding substance 40 as well: the solder reflow temperature must not exceed the reflow temperature of device interconnects 26. In addition, if bonding substances 34 and 40 are different types of solder, the reflow temperature of solder/bonding substance 34 should not exceed the reflow temperature of solder/bonding substance 40. Alternatively, bonding substance 34 may be an epoxy, and may optionally include thermally conductive particles such as silver or aluminum nitride, similar to the thermally conductive epoxy described with respect to bonding substance 40. Since heat transfer is less important at the perimeter bond, thermally conductive particles are optional within bonding substance 34. In embodiments where an epoxy is used as bonding substance 34, and a solder used as bonding substance 40, the cure temperature of epoxy/bonding substance 34 must be below the reflow temperature of solder/bonding substance 40. Also, bonding substance 34 may be a gasket, either adhering to both perimeter surfaces 16 and 32, or held in place by way of a compressive force applied between barrier 30 and substrate 10.

In general, bonding substance 34 need not be the same material, or even within the same class of materials, as bonding substance 40. Any selection of bonding substance 34 may be used with any selection of bonding substance 40. Two preferred assembly methods are described herein, however, describing the use of similar materials for both types of bonds. Other embodiments are envisioned using different materials for bonding substances 34 and 40, within the spirit and scope of the present invention.

Assembly Using Solder

Device upper surface 22 and substrate perimeter 16 should be prepared with an adhesion layer prior to application of solder. A layer of Cr—Ni—Au metallurgy should be applied to the device upper surface 22, since solder adheres poorly to silicon. A similar Cr—Ni—Au structure should be applied to perimeter area 16, where perimeter 16 is to come in contact with barrier perimeter 32. Alternatively, a copper band might be applied to substrate perimeter 16 during the normal production process for substrate 10, where copper interconnects are formed on the upper layer of substrate 10. Either Ni—Au or Cr—Ni—Au should be applied to the copper band, as described herein with respect to surface preparation for barrier 30. In general, to insure solder adhesion to barrier 30, a layer of either Ni—Au or Cr—Ni—Au should be applied to perimeter 32 and device contact area 38.

Once surface preparation is complete, solder is applied to at least one surface within each bonding surface pair. For example, solder may be applied to substrate perimeter 16 and device upper surfaces 22, or solder may be applied to barrier perimeter 32 and device contact areas 38. In this manner, at least one surface within each pair of surfaces to be bonded (i.e. within each bonding surface pair) is coated with solder. Preferably, all surfaces to be bonded are coated with solder. Alternatively, a set of solder pre-forms may be used, as illustrated in FIG. 1. Such solder pre-forms are made of low temperature solder, such as lead-tin eutectic solder, and formed in advance according to the size and shape of the perimeter and device bonding surface pairs. The solder pre-forms should also include a plurality of mechanical stand-offs, such as copper spheres, insuring proper spacing between surfaces during reflow and compression. The diameter of the copper spheres is approximately equal to the desired joint thickness.

Barrier 30 is aligned with substrate assembly 10, using appropriate alignment aids as previously discussed. Barrier 30 and substrate assembly 10 are preferably placed into an environment containing an inert gas, such as helium, argon, or nitrogen, in order to create an inert environment within the region of the final assembly between the lower surface of barrier 30 and substrate upper surface 12. Of the inert gases listed, helium is preferred due to its superior thermal conduction properties. Alternatively, if a suitable corrosion inhibitor has been applied to device interconnects 26, the assembly steps may be performed within an air environment. Once the assembly is optionally within an inert environment and barrier 30 is aligned to substrate 10, barrier 30 and substrate 10 are heated to the solder reflow temperature, thereby melting the solder. Barrier 30 is next brought into contact with substrate 10, causing the bonding surface pairs to contact. A compressive force is applied at the assembly perimeter, holding the perimeter bonding surface pair in contact. If barrier 30 is formed such that this perimeter force is sufficient to maintain contact between device upper surface 22 and device contact area 38, no additional external force need be applied to maintain contact within device bonding surface pairs. Alternatively, a mold structure may be used to provide additional external force to device contact areas 38, thereby maintaining contact between device bonding surface pairs. The assembly is allowed to cool while remaining under compressive force, and while remaining within the inert environment. Once the assembly has cooled and the solder has solidified, the assembly may be removed.

Alternatively, barrier 30 and substrate 10 may be brought into contact before being heated. Using this method, care should be taken to avoid heated gasses from within the region between barrier 30 and substrate 10 from creating bubbles or voids within perimeter solder bond 34. Solder voids may be prevented by controlling the time-temperature profile of the oven within which assembly 100 is heated. By slowly raising the temperature of assembly 100 to just below the reflow temperature of bonding substance 34 (i.e. solder in this embodiment) and allowing some soak time at this temperature, heated gasses within the assembly will escape while solder 34 remains solid. Further increasing the temperature of assembly 100 to the solder reflow temperature will result in minimal additional expansion and escape of gasses within assembly 100, thereby minimizing solder voids.

Regarding the order of fabrication steps, alternative embodiments are envisioned within the spirit and scope of the present invention which deviate from the order presented. While surface adhesion promoters must be applied prior to the solder, these two steps may be performed at any time in relation to the steps of aligning barrier 30 with substrate assembly 10, and placing barrier 30 and substrate assembly 10 within an inert environment. Preferably, the above steps are complete prior to heating barrier 30 and substrate 10 to the solder reflow temperature.

Assembly Using Epoxy

Surface preparation is optional when epoxy is used as bonding materials 34 and 40. Optionally, an adhesion promoter such as 3-aminopropyl triethoxysilane may be applied to device upper surface 22 in order to promote adhesion between surface 22 and epoxy bonding substance 40. Such an adhesion promoter may optionally be applied to other bonding surfaces, such as substrate perimeter 16, barrier perimeter 32, or device contact areas 38.

As previously noted, the epoxy used as bonding substance 40 should be thermally conductive, using conductive particles such as silver or aluminum nitrate. Thermal enhancement is optional for the epoxy used as bonding substance 34, however practical considerations may make it preferable to use the same thermally conductive epoxy as both bonding substances 34 and 40.

The two epoxy parts, base and curing agent, are mixed. The resulting mixture is applied to at least one surface within each bonding surface pair, as described with respect to solder application. Preferably, the mixture is applied to all surfaces to be bonded.

Barrier 30 is aligned with substrate assembly 10, using appropriate alignment aids as previously discussed. Barrier 30 and substrate assembly 10 are preferably placed into an environment containing an inert gas, such as helium, argon, or nitrogen, in order to create an inert environment within the region of the final assembly between the lower surface of barrier 30 and substrate upper surface 12. Of the inert gases listed, helium is preferred due to its superior thermal conduction properties. Alternatively, if a suitable corrosion inhibitor has been applied to device interconnects 26, the assembly steps may be performed within an air environment. Once the assembly is optionally within an inert environment and barrier 30 is aligned to substrate 10, barrier 30 is brought into contact with substrate 10, causing the bonding surface pairs to contact. A compressive force is applied at the assembly perimeter, holding the perimeter bonding surface pair in contact. If barrier 30 is formed such that this perimeter force is sufficient to maintain contact between device upper surface 22 and device contact area 38, no additional external force need be applied to maintain contact within device bonding surface pairs. Alternatively, a mold structure may be used to provide additional external force to device contact areas 38, thereby maintaining contact between device bonding surface pairs. The epoxy is allowed to cure while remaining under compressive force, and while remaining within the inert environment. Assembly 100 may be maintained at room temperature during the epoxy cure step, however a reduced cure time may be achieved by elevating the temperature of assembly 100 during epoxy cure. Once the epoxy has cured, the assembly may be removed from the inert environment.

Regarding the order of fabrication steps, alternative embodiments are envisioned which deviate from the order presented, within the spirit and scope of the present invention. While surface adhesion promoters must be applied prior to the solder, these two steps may be performed at any time in relation to the steps of aligning barrier 30 with substrate assembly 10, and placing barrier 30 and substrate assembly 10 within an inert environment. All of the above steps should be complete prior to bringing barrier 30 and substrate 10 into contact.

Passivated Module Assembly Methods

As illustrated in FIG. 6, electronic module assembly 110 is fabricated using three components: completed substrate assembly 100, bonding substance 62, and module cap 60. The procedures used to fabricate substrate assembly 100 have been described. Any of the substances used for bonding substance 34 may also be used for bonding substance 62. While the primary function of bonding substance 62 is to form a liquid-tight seal, thermal transfer is also a consideration, since heat transfer takes place from barrier 30 to cap 60 through the interface created by bonding substance 62. For these reasons, solder and thermally conductive epoxy are the preferred materials for bonding substance 62. Alternatives such as standard epoxy, a gasket, or an O-ring are also envisioned, within the spirit and scope of the present invention.

Bonding substance 62 is applied to either module cap perimeter surface 61, or the upper surface of barrier perimeter 32. In preferred embodiments using solder or thermally conductive epoxy, bonding substance 62 is preferably applied to both surfaces 61 and perimeter 32 upper surface. Module cap 60 is aligned with assembly 100, using alignment aids as discussed with respect to alignment of barrier 30 and substrate 10. In embodiments using module cap 60 (without fluid inlet or outlet), fluid fill port 68 is open during the assembly process. In embodiments using module cap 70, fluid inlet and outlet 72a and 72b, respectively, remain open during the assembly process.

Module cap 60 (or 70) is brought into contact with assembly 100, causing surface 61 to contact barrier perimeter 32 upper surface. In embodiments using solder, the assembly is heated to the solder reflow temperature. This step may be performed prior to bringing assembly 100 into contact with module cap 60 (or 70), or after contact. Since either fluid fill port 68 or fluid inlet and outlet 72a and 72b remain open during the assembly process, expanding gases within assembly 110 have a means of escape without creating solder voids. Bonding substance 62 is allowed to cure, either by cooling assembly 110 (solder) or by allowing sufficient setting time at room temperature (epoxy).

In applications where bonding substances 34 and/or 40 are solder, care should be taken to preserve the perimeter and device bonds, respectively, of assembly 100 during the module assembly process. In particular, exposing completed assembly 100 to temperatures in excess of the reflow temperature of solder 34 or solder 40 could impair the integrity of the solder bonds. Several methods may be used to preserve the bonds within assembly 100. For example, bonding substance 62 may be a thermally conductive epoxy, cured at a temperature below the reflow temperature of solder 34 and solder 40. Alternatively, bonding substance 62 may be a solder with a lower reflow temperature than solder 34 and solder 40, thereby eliminating the need to heat assembly 100 above the reflow temperature of solder 34 and solder 40. In embodiments using the same solder for all bonding substances 34, 40, and 62, two methods are available. A single reflow cycle may be used to form all bonds within device 110, by first aligning and assembling substrate 10, bonding substances 34 and 40, barrier 30, bonding substance 62, and cap 60 (or 70), as illustrated in FIG. 6 and described herein. Once assembled, device 110 is heated to the solder reflow temperature, forming all solder bonds during a single reflow. Alternatively, substrate assembly 100 may be formed in advance, and means provided to hold assembly 100 in place during the reflow of solder 62.

Once bonding substance 62 has cured, thereby completing module assembly 110, assembly 110 may optionally be filled with a cooling fluid such as water or other aqueous fluids. In embodiments employing cap 60, fluid is introduced through fluid fill port 68. Gases within assembly 110 are allowed to escape through fluid fill port 68. When full, assembly 110 is sealed by any means known in the art, such as by inserting threaded bolt 69 into fluid fill port 68. In embodiments using cap 70, ports 72a and 72b are preferably connected to an external fluid circulation system, such as a chilled water distribution system or an external condenser, prior to or during the process of introducing cooling fluid into assembly 110.

While the invention has been described in detail herein in accord with certain preferred embodiments thereof, many modifications and changes therein may be effected by those skilled in the art. Accordingly, it is intended by the appended claims to cover all such modifications and changes as fall within the true spirit and scope of the invention.

What is claimed is:

1. An electronic module substrate assembly comprising:
   a substrate;
   an electronic device electrically connected to said substrate;
   a metal barrier, said barrier having
      a perimeter area, said barrier perimeter area being sealably affixed to said substrate at its periphery,
      at least one fold to accommodate thermal expansion;
      a device contact area, said device contact area being bonded and thermally coupled to an upper surface of said electronic device.

2. The apparatus of claim 1, wherein said substrate assembly includes a plurality of said electronic devices, a plurality of said folds, and a plurality of said device contact areas.

3. The apparatus of claim 1, wherein said barrier includes a plurality of said folds.

4. The apparatus of claim 1, further comprising at least one passive electronic device electrically connected to said substrate.

5. The apparatus of claim 4, wherein at least one passive device extends above said electronic device upper surface, and wherein one or more of said at least one fold is raised above said device contact area, said at least one passive device positioned below one of said one or more raised folds.

6. The apparatus of claim 1, wherein said device contact area is bonded and thermally coupled to said electronic device upper surface by soldering.

7. The apparatus of claim 1, wherein said device contact area is bonded and thermally coupled to said electronic device upper surface using thermally conductive epoxy.

8. The apparatus of claim 1, wherein said barrier perimeter is sealably affixed to said substrate first surface by soldering.

9. The apparatus of claim 1, wherein said barrier perimeter is sealably affixed to said substrate first surface with thermally conductive epoxy.

10. The apparatus of claim 1, wherein said metal barrier is formed of a material selected from the group consisting of copper, titanium, aluminum, stainless steel, and molybdenum.

11. The apparatus of claim 1, wherein said barrier is hermetically sealed to said substrate first surface perimeter area.

12. The apparatus of claim 1, further comprising an inert gas filling a volume between said barrier and said substrate upper surface.

13. The apparatus of claim 3, wherein said plurality of folds are raised above said device contact area.

14. An electronic module comprising:

a substrate;

an electronic device electrically connected to said substrate;

a metal barrier, said barrier having
- a perimeter area, said barrier perimeter area being sealably affixed to said substrate at its periphery;
- at least one fold to accommodate thermal expansion;
- a device contact area, said device contact area being bonded and thermally coupled to an upper surface of said electronic device, and
- a module cap sealably affixed to an upper surface of said barrier perimeter area, said cap and said barrier forming an internal volume capable of containing a cooling fluid.

15. The apparatus of claim 14, further comprising an aqueous cooling fluid.

16. The apparatus of claim 14, wherein said module further comprises a fluid inlet and a fluid outlet.

17. The apparatus of claim 14, wherein one or more of said at least one folds is raised above said device contact area.

18. The apparatus of claim 17, further comprising at least one passive electronic device electrically connected to said substrate, said at least one passive device extending above said electronic device upper surface, said at least one passive device positioned below one of said at least one raised folds.

19. The apparatus of claim 14, wherein said barrier perimeter is sealably affixed to said substrate first surface with thermally conductive epoxy.

20. A method of passivating an electronic module substrate assembly, said electronic module substrate assembly including a substrate and at least one electronic device, said substrate including a perimeter area, said method comprising the steps of:

sealably affixing a metal barrier to said substrate perimeter area, said metal barrier having at least one fold to accomodate thermal expansion;

bonding and thermally coupling said metal barrier to at least one electronic device.

21. The method of claim 20, wherein said metal barrier is formed of a material selected from the group consisting of copper, titanium, aluminum, stainless steel, and molybdenum.

22. The method of claim 20, further comprising the step of forming at least one fold in said barrier.

23. The method of claim 22, wherein said forming is accomplished by stamping.

24. The method of claim 22, wherein said forming is selected from the group consisting of electroforming, sputtering, vapor deposition, and ion vapor deposition.

25. The method of claim 20, wherein said barrier includes a plurality of folds.

26. The method of claim 20, wherein said affixing is performed using solder.

27. The method of claim 26, wherein said solder is preformed in a shape similar to said substrate perimeter.

28. The method of claim 20, wherein said bonding and coupling is performed using solder.

29. The method of claim 28, wherein said solder is preformed in a shape similar to said electronic device.

30. The method of claim 20, wherein said affixing is performed using thermally conductive epoxy.

31. The method of claim 20, wherein said coupling is performed using thermally conductive epoxy.

32. The method of claim 20, further comprising the step of sealably affixing a module cap to said barrier.

33. The method of claim 25, further comprising the steps of:

electrically connecting at least one passive device to said substrate, said at least one passive device extending above an upper surface of said at least one electronic device;

positioning one of said plurality of raised folds above said at least one passive device.

34. The method of claim 32, wherein said affixing is performed using thermally conductive epoxy.

* * * * *